United States Patent
Ishikawa

(10) Patent No.: US 12,409,656 B2
(45) Date of Patent: Sep. 9, 2025

(54) METHOD FOR MANUFACTURING ELEMENT SUBSTRATE, ELEMENT SUBSTRATE, AND LIQUID EJECTION HEAD

(71) Applicant: CANON KABUSHIKI KAISHA, Tokyo (JP)

(72) Inventor: Tetsushi Ishikawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 254 days.

(21) Appl. No.: 18/184,076

(22) Filed: Mar. 15, 2023

(65) Prior Publication Data
US 2023/0311493 A1  Oct. 5, 2023

(30) Foreign Application Priority Data

Mar. 30, 2022 (JP) .................. 2022-055449

(51) Int. Cl.
| | |
|---|---|
| B41J 2/16 | (2006.01) |
| B41J 2/045 | (2006.01) |
| B41J 2/165 | (2006.01) |
| B41J 2/175 | (2006.01) |
| B41J 2/25 | (2006.01) |
| G03F 1/48 | (2012.01) |
| G03F 1/50 | (2012.01) |
| G03F 1/82 | (2012.01) |

(52) U.S. Cl.
CPC ......... *B41J 2/1621* (2013.01); *B41J 2/04586* (2013.01); *B41J 2/1607* (2013.01); *B41J 2/162* (2013.01); *B41J 2/16502* (2024.05); *B41J 2/17503* (2013.01); *B41J 2/25* (2013.01); *G03F 1/48* (2013.01); *G03F 1/50* (2013.01); *G03F 1/82* (2013.01)

(58) Field of Classification Search
CPC . B41J 2/16; B41J 2/1606; B41J 2/1607; B41J 2/162; B41J 2/1621; B41J 2/165; B41J 2/16502
See application file for complete search history.

(56) References Cited

U.S. PATENT DOCUMENTS

2006/0012656 A1* 1/2006 Suzuki ................... H01L 21/00
   347/100
2009/0244173 A1* 10/2009 Yokouchi ............... B41J 2/1433
   347/47

FOREIGN PATENT DOCUMENTS

JP    2010-5994 A    1/2010

* cited by examiner

Primary Examiner — Douglas X Rodriguez
Assistant Examiner — Kendrick X Liu
(74) Attorney, Agent, or Firm — Venable LLP

(57) ABSTRACT

Provided is a method for manufacturing an element substrate for use in a liquid ejection head for ejecting a liquid to a recording medium. The element substrate, includes: a substrate having a nozzle including an ejection port, and a pressure generating chamber communicating with the nozzle, and subjected to a liquid repellent treatment on a part of a surface on a side opposed to the recording medium; and a generating element for generating an energy for ejecting the liquid. The method for manufacturing an element substrate includes: a liquid repellent treatment step of performing the liquid repellent treatment on the substrate; and a liquid repellent region removing step of removing a part of a liquid repellent region subjected to the liquid repellent treatment so that a non-liquid repellent region not subjected to the liquid repellent treatment is exposed at a surface of the substrate opposed to the recording medium.

10 Claims, 8 Drawing Sheets

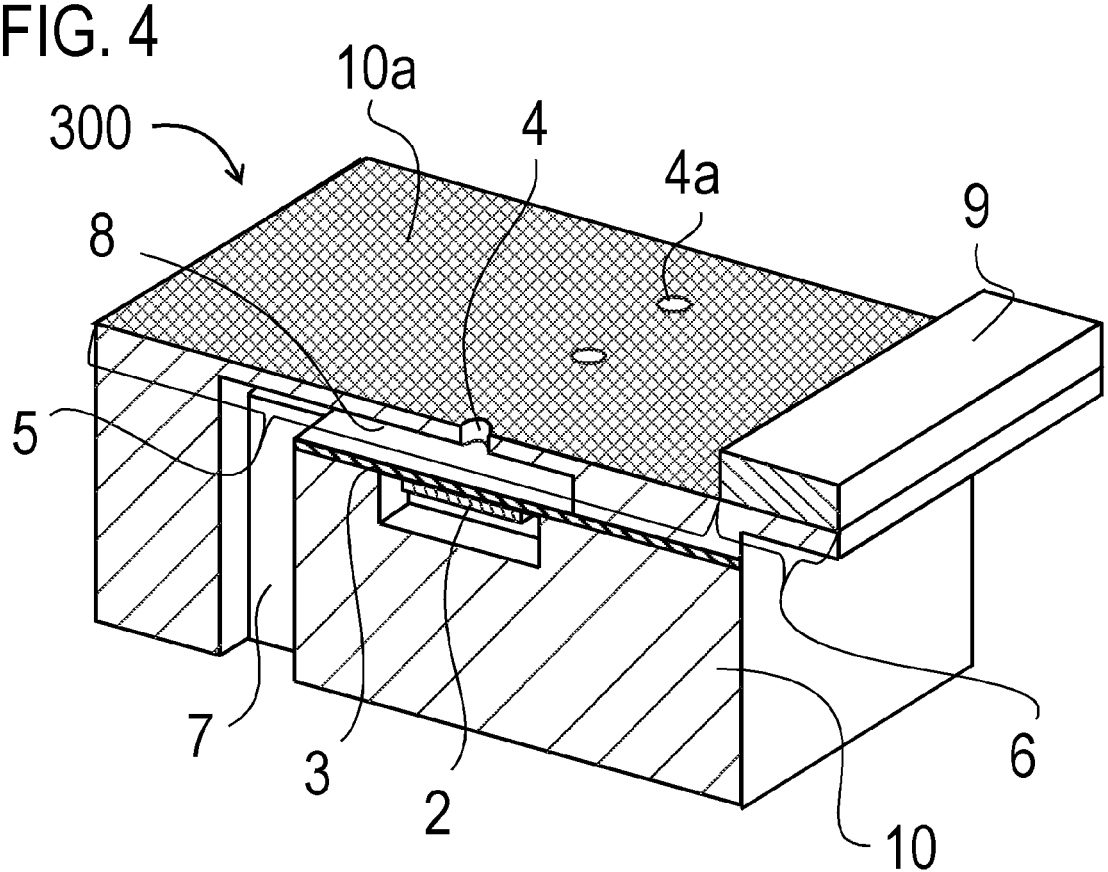

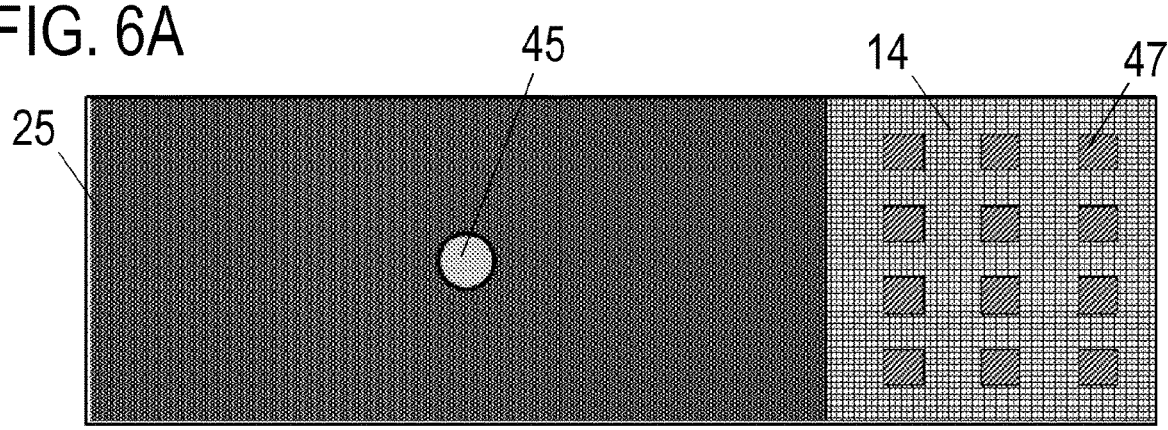
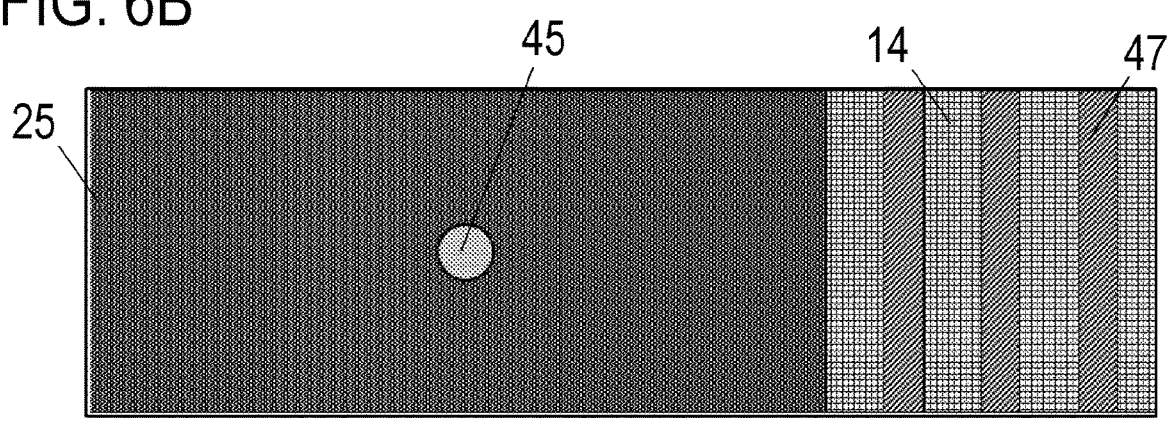

METHOD FOR MANUFACTURING ELEMENT SUBSTRATE, ELEMENT SUBSTRATE, AND LIQUID EJECTION HEAD

BACKGROUND OF THE INVENTION

Field of the Invention

The present invention relates to an element substrate, a liquid ejection head including the element substrate, and a method for manufacturing the element substrate.

Description of the Related Art

A recording device (liquid ejection device) using an ink jet system ejects and let fly an ink (recording liquid) droplet from the ejection port formed on an element substrate by a liquid ejection head including the element substrate, and thereby performs recording. For such an element substrate, in order to prevent the reduction of the ejection performance due to deposition of droplets in the vicinity of the ejection port, a liquid repellent treatment has been conventionally performed on the vicinity of the ejection port on the surface in which the ejection port is formed.

Japanese Patent Application Publication No. 2010-5994 discloses a patterning method of a liquid repellent film as the method for performing a liquid repellent treatment on the substrate forming the element substrate. When patterning is performed using a resist mask, after performing a surface treatment, and carrying out a hydrophilization treatment, a resist is formed, patterning is performed, and a fluorine plasma treatment is performed. As a result, the liquid repellency is recovered.

SUMMARY OF THE INVENTION

However, with the foregoing method, the ink repellent performance is recovered after hydrophilization. For this reason, the liquid repellent treatment property is not stable, and tends to vary.

Under such circumstances, it is an object of the present invention to provide an element substrate having a stable ejection performance.

In order to achieve the foregoing object, the method for manufacturing an element substrate for use in a liquid ejection head for ejecting a liquid to a recording medium, the element substrate includes:

a substrate having a nozzle including an ejection port opposed to the recording medium, and a pressure generating chamber communicating with the nozzle, and subjected to a liquid repellent treatment on a part of an ejection port surface including the ejection port formed therein; and a generating element for generating an energy for ejecting the liquid in the pressure generating chamber from the ejection port, the method for manufacturing an element substrate, comprising:

a liquid repellent treatment step of performing the liquid repellent treatment on the substrate; and a liquid repellent region removing step of removing a part of a liquid repellent region which is subjected to the liquid repellent treatment such that a non-liquid repellent region which is not subjected to the liquid repellent treatment is exposed at a surface of the substrate opposed to the recording medium.

Further, in order to attain the foregoing object, an element substrate for use in a liquid ejection head for ejecting a liquid to a recording medium, includes:

a substrate having a nozzle including an ejection port opposed to the recording medium, and a pressure generating chamber communicating with the nozzle, and including a liquid repellent region subjected to a liquid repellent treatment and formed at a part of an ejection port surface including the ejection port formed therein; and a generating element for generating an energy for ejecting the liquid in the pressure generating chamber from the ejection port, wherein an entire region of a portion of the ejection port surface overlapping the pressure generating chamber is the liquid repellent region as seen from a direction perpendicular to the ejection port surface.

The present invention can provide an element substrate having a stable ejection performance.

Further features of the present invention will become apparent from the following description of exemplary embodiments with reference to the attached drawings.

BRIEF DESCRIPTION OF THE DRAWINGS

FIG. 4 is a perspective view of an element substrate in accordance with a third embodiment;

FIGS. 6A and 6B are each a top view of the element substrate in accordance with the third embodiment;

DESCRIPTION OF THE EMBODIMENTS

Hereinafter, a description will be given, with reference to the drawings, of embodiments (examples) of the present invention. However, the sizes, materials, shapes, their relative arrangements, or the like of constituents described in the embodiments may be appropriately changed according to the configurations, various conditions, or the like of apparatuses to which the invention is applied. Therefore, the sizes, materials, shapes, their relative arrangements, or the like of the constituents described in the embodiments do not intend to limit the scope of the invention to the following embodiments.

First Embodiment

A liquid ejection head in accordance with the present invention is applicable to a device such as a printer as a recording device (liquid ejection device), a copier, or a facsimile. In the present embodiment, a description will be given by taking the liquid ejection head to be provided in an ink jet printer as a recording device as an example. The recording device is provided with a liquid accommodation portion for accommodating a liquid such as an ink to be supplied to the liquid ejection head, a transport mechanism of a recording medium for performing recording, or the like in addition to the liquid ejection head. Further, the liquid ejection head may be mounted on the recording device as a cartridge formed integrally with the liquid accommodation portion for supplying a liquid to the liquid ejection head. Further, as the liquid ejection head, a piezoelectric element may be used as a generating element for generating an energy for ejecting a liquid, or an element for generating a heat energy such as a heater may be used. Below, a description will be given to the case where the present invention is applied to the liquid ejection head using a piezoelectric element.

Configuration of Element Substrate

Figure 1:
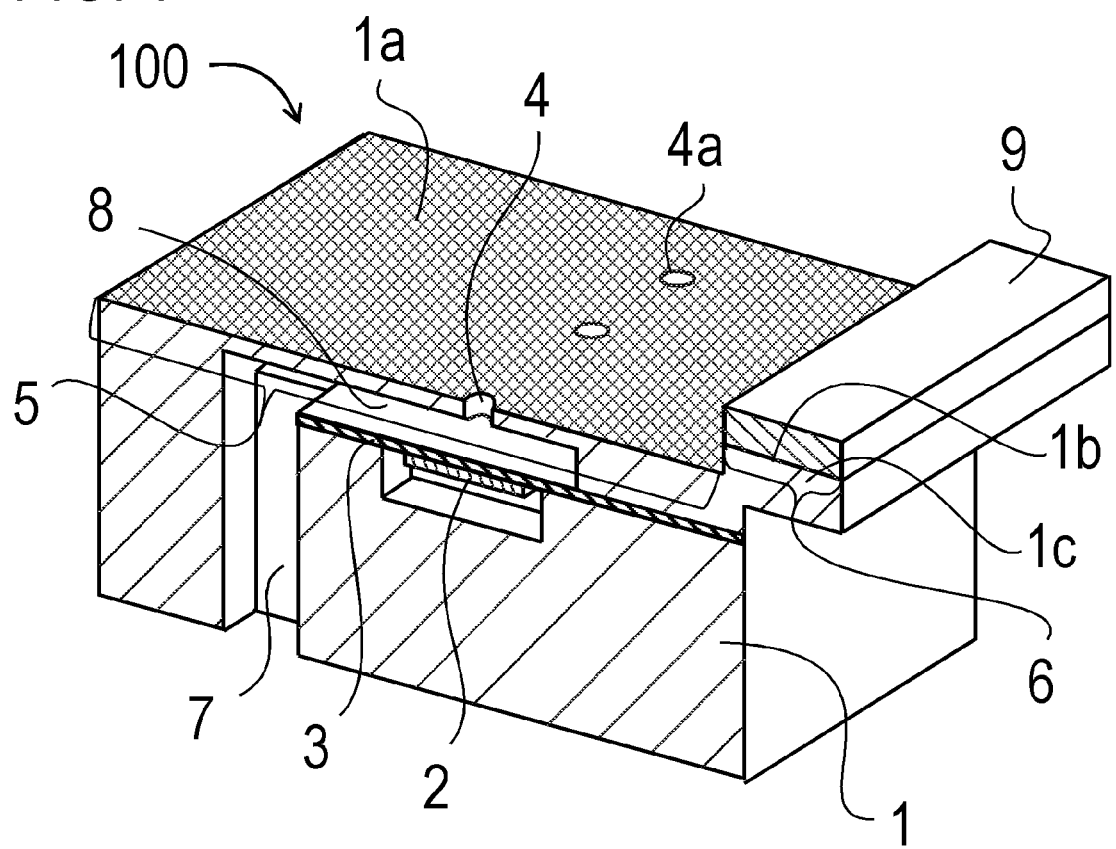
FIG. 1 is a perspective view of an element substrate in accordance with a first embodiment.

FIG. 1 is a schematic view of an element substrate 100 in accordance with a first embodiment. For the element substrate 100 as a substrate for a liquid ejection head, a piezoelectric element 2 and a diaphragm 3 for generating an energy for ejecting a liquid such as an ink are arranged on a substrate 1. Further, at the substrate 1, a passage 7 for the liquid to pass therethrough, a foaming chamber 8 as a pressure generating chamber, and a nozzle 4 including an ejection port 4a opposed to the recording medium are formed in communication with one another. The nozzle 4 is configured such that an ejection port 4a extends in the direction opposed to the recording medium, so that the liquid which has passed through the passage 7, the foaming chamber 8, and the nozzle 4 is ejected toward the recording medium such as recording paper. The surface of the substrate 1 facing the recording medium side includes an ejection port surface 1a including the ejection port 4a of the nozzle 4 formed therein as a first surface, and a protruding surface 1b protruding toward the recording medium side from the ejection port surface 1a as a second surface. Namely, at the substrate 1, a protruded portion 1c protruding toward the recording medium side with respect to the ejection port surface 1a is formed. In the present embodiment, the ejection port surface 1a is subjected to a liquid repellent treatment, and becomes an ink repellent region (liquid repellent region) 5. On the other hand, the protruding surface 1b is a non-ink repellent region (non-liquid repellent region) 6 not subjected to a liquid repellent treatment. A protective member 9 for protecting a nozzle plate is bonded and joined with the top of the protruding surface 1b.

The element substrate 100 is connected with a housing for accommodating a liquid. The liquid supplied from the housing passes through the path for the liquid including the passage 7 in the substrate 1, or the like. Accordingly, the liquid is ejected from the nozzle 4 of the element substrate 100 toward the recording medium. The element substrate 100 is electrically connected with an electric wiring member, and ejects a liquid according to the instructions received from the recording device via the electric wiring member.

For the substrate 1, a silicon substrate including a piezoelectric element, an electric wire, a liquid passage including a foaming chamber or the like, and a diaphragm formed therein by the MEMS (Micro Electro Mechanical Systems) technology is used. The silicon substrate is further joined with a silicon substrate including an ejection port formed therein, thereby forming the substrate 1. Namely, the substrate 1 is formed by joining various substrates such as a passage substrate and an actuator substrate. In the substrate 1, the path for a liquid to pass therethrough is formed, and additionally, the space in which a piezoelectric element 2 and an electrode for operating the piezoelectric element 2 are provided is formed.

The path for a liquid to pass in the substrate 1 includes the passage 7, the foaming chamber 8, and the nozzle 4. The passage 7 communicates with the housing for accommodating a liquid, so that the liquid passes from the passage 7 to the foaming chamber 8. The foaming chamber 8 is a liquid chamber for storing the liquid ejected from the nozzle 4, and is formed in communication with the nozzle 4. The nozzle 4 is a path extending in parallel with the stacking direction of the substrate 1, and a plurality of nozzles 4 are formed on the substrate 1.

The piezoelectric element 2 is for generating a vibration energy for liquid ejection, and is provided correspondingly to each of the nozzles 4. The diaphragm 3 is arranged so as to face the foaming chamber 8, and is vibrated by the piezoelectric element 2 provided on the diaphragm 3. The piezoelectric element 2 and the diaphragm 3 are arranged so as to overlap the nozzle 4 as seen from the direction perpendicular to the ejection port surface 1a. The vibration of the piezoelectric element 2 is transmitted to the liquid in the foaming chamber 8 (in the pressure generating chamber) via the diaphragm 3. As a result, the liquid is pressurized, and is ejected from the ejection port.

As described above, the ejection port surface 1a of the substrate 1 including the ejection port 4a of the nozzle 4 formed therein is subjected to a liquid repellent treatment. By setting the ejection port 4a vicinity as the ink repellent region 5, it is possible to suppress deposition of scattered droplets or the like on the ejection port vicinity, and it is possible to prevent the reduction of the ejection performance. Incidentally, the ejection port surface 1a is not necessarily required to be entirely set as the ink repellent region 5. The portion which scarcely affects the ejection performance even when droplets are deposited thereon is not required to be subjected to a liquid repellent treatment, and may be set as a non-ink repellent region 6.

Further, the protruding surface 1b of the protruded portion 1c more protruding in the stacking direction than the ejection port surface 1a is the non-ink repellent region 6 not subjected to a liquid repellent treatment. The protruded portion 1c is provided at a position not overlapping the foaming chamber 8 as seen from the direction perpendicular to the ejection port surface 1a. By setting the protruding surface 1b as the non-ink repellent region 6, it is possible to bond another member such as the protective member 9 onto the substrate 1 with good adhesion using an adhesive or the like. Further, it is configured such that the protruding surface 1b is situated higher than the ejection port surface 1a. As a result, the height of the protective member 9 can be minimized, which can suppress the reduction of the strength of the protective member 9.

The protective member 9 is a member for suppressing the contact between a cleaning member such as a wiper for use in ejection recovery of a liquid ejection device and the substrate 1. In the stacking direction, the upper surface of the protective member 9 is at a higher position than that of the upper surface (nozzle 4 forming surface) of the substrate 1, and is provided on the non-ink repellent region 6 (on the non-liquid repellent region). Provision of the protective member 9 can suppress a strong contact between the cleaning member and the substrate 1, which can prevent breakage or the like of the substrate 1.

In the present embodiment, the protective member 9 is arranged so that the ridgeline of the protective member 9 and the ridgeline of the protruded portion 1c on the ejection port 4a side overlap each other as seen from the direction perpendicular to the ejection port surface 1a. Further, the ink repellent region 5 is formed to the end on the ejection port 4a side of the protective member 9. As seen from the direction perpendicular to the ejection port surface 1a, the boundary between the ink repellent region 5 and the non-ink repellent region 6 overlaps the end of the protective member 9. Further, the protruded portion 1c and the protective member 9 are provided at the position not overlapping the foaming chamber 8 as seen from the direction perpendicular to the ejection port surface 1a. For this reason, the region in the vicinity of the ejection port 4a is assumed to be the ink repellent region 5, resulting in a configuration effective for suppressing the ejection performance. Furthermore, the protective member 9 is provided at a position separated from the ejection port 4a. For this reason, the protective member 9 can also suppress the reduction of the ejection performance, and further can prevent breakage or the like of the substrate 1 at the time of cleaning the ejection port surface 1a.

Method for Manufacturing Element Substrate

Then, regarding the method for manufacturing the element substrate 100, a method for forming an ink repellent region characteristic of the present invention will be mainly described. The element substrate is manufactured in the following manner. For example, on a silicon wafer, a plurality of metal layers are stacked, and an ejection port, and the like are formed; then, the resulting lamination is separated into one by one by a dicing device, or the like. Below, the manufacturing steps of the element substrate from after the ejection port formation to the cutting step with a dicing device characteristic of the present invention will be mainly described.

FIGS. 2A to 2D are each a cross sectional schematic view showing a method for manufacturing the element substrate 100 in accordance with a first embodiment. Incidentally, in the following description, a description will be given by distinguishing a finished product and a state during manufacturing. For this reason, the members substantially similar to the members or the like described in FIG. 1 may be given different numerals and signs for description.

The element substrate 100 is configured in a lamination including a passage substrate 11, an actuator substrate 12, and a nozzle substrate 13 sequentially from the lower layer. The substrates each include, for example, a silicon substrate, and exposure and development of a polyresist, and subsequent Si dry etching form a prescribed passage, or the like.

Figure 2A:
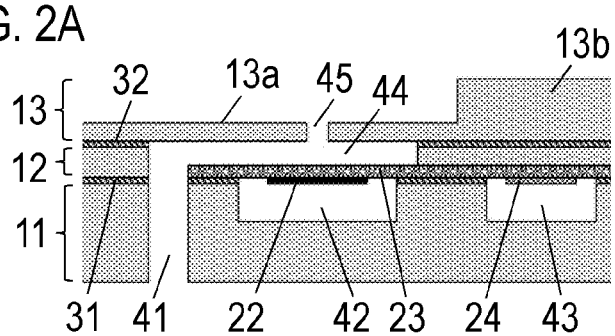
FIGS. 2A to 2D are each a view illustrating a method for manufacturing the element substrate in accordance with the first embodiment.

The passage substrate 11 is provided with a passage 41 to which a liquid is supplied, a depressed portion 42 in the inside of which the piezoelectric element 22 is arranged, a depressed portion 43 in the inside of which an electrode 24 is arranged, and the like. On the passage substrate 11, the actuator substrate 12 including the piezoelectric element 22 and the diaphragm 23 is formed by the joining technology using an adhesive 31 or the like. To the piezoelectric element 22, for example, a PZT (lead titanate zirconate) film is applied, and includes a sintered compact of a metal oxide crystal. Further, on the actuator substrate 12, the nozzle substrate 13 on which a nozzle 45 is formed is formed by a joining technology using an adhesive 32 or the like. FIG. 2A shows a state in which the passage substrate 11, the actuator substrate 12, and the nozzle substrate 13 are stacked, and various paths and spaces are formed, so that the substrates are processed into a desirable shape. The opening precision of the nozzle 45, or the like is in proportion to the precision of photolithography such as exposure of a polyresist. For this reason, the formation is possible with a precision of 1 μm or less.

As shown in FIG. 2A, the actuator substrate 12 and the nozzle substrate 13 form a foaming chamber 44. The foaming chamber 44 communicates with the passage 41 and the nozzle 45, and is provided for accommodating the ink supplied from the passage 41, and ejecting the ink from the nozzle 45. The lower surface of the foaming chamber 44 includes the diaphragm 23 of the actuator substrate 12, and the piezoelectric element 22 is provided at the position of the lower surface of the diaphragm 23 corresponding to the nozzle 45. In this manner, the nozzle 45, the diaphragm 23, and the piezoelectric element 22 are provided at their overlapping position. As a result, the liquid can be ejected from the nozzle 45 by the vibration energy generated by the piezoelectric element.

Further, the nozzle substrate 13 has the upper surface formed in a step shape, so that a protruded portion 13b situated higher than the ejection port surface 13a is provided with respect to the ejection port surface 13a in which the ejection port of the nozzle 45 is formed. The protruded portion 13b is provided shifted from directly above the foaming chamber 44.

Figure 2B:
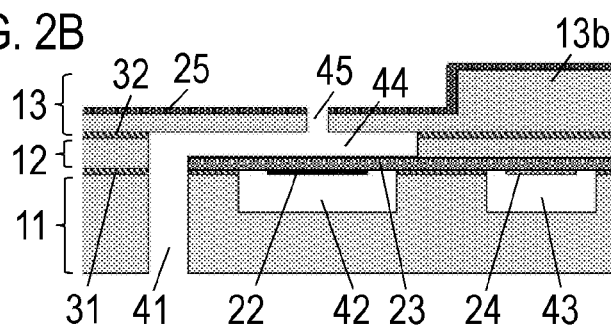

After processing into a desirable shape, a liquid repellent treatment by which, as shown in FIG. 2B, an ink repellent film is deposited on the upper surface of the nozzle substrate 13 by the vacuum evaporation method, and the ink repellent region 25 is formed is performed. The ink repellent film is preferably a fluoride. As a fluoride, mention may be made of a fluorine resin material, or the like. Incidentally, for the deposition method, other methods than the vacuum evaporation method may be used. By the present step, the ejection port surface 13a and the protruded portion 13b of the nozzle substrate 13 are covered with an ink repellent film, thereby forming the ink repellent region 25.

Figure 2C:
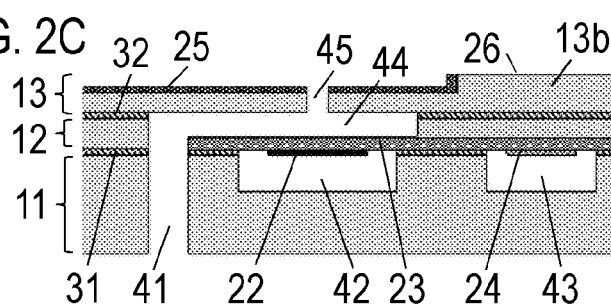

Then, as shown in FIG. 2C, a liquid repellent treatment removing step in which the top of the protruded portion 13b is removed together with the ink repellent region 25 by grinding or the like is performed. With the present step, the ink repellent region 25 is removed from the upper surface of the protruded portion 13b, and a non-ink repellent region 26 is formed on the upper surface of the protruded portion 13b.

As described above, the nozzle is formed by photolithography. For this reason, when the initial height of the protruded portion 13b is large, the surface unevenness of the nozzle substrate 13 is large, resulting in a difficulty in resist formation. On the other hand, when the initial height of the protruded portion 13b is too low, thinning and removal of the ink repellent film become difficult. Therefore, the initial height of the protruded portion 13b relative to the ejection port surface 13a shown in FIG. 2A is preferably about 10 μm to 100 μm. Further, the height after grinding of the protruded portion 13b relative to the ejection port surface 13a shown in FIG. 2C is preferably about 5 μm to 50 μm.

Figure 2D:
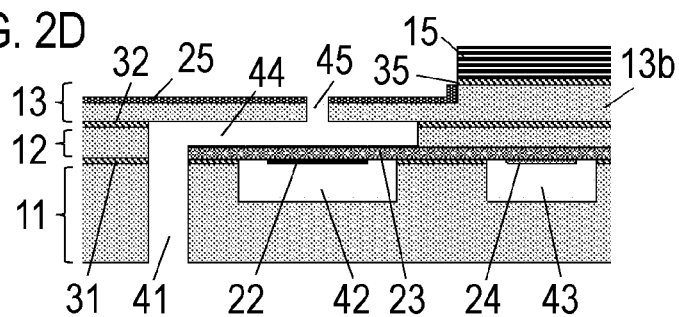

Then, as shown in FIG. 2D, a joining step of joining a protective member 15 on the protruded portion 13b of the nozzle substrate 13 is performed. The upper surface of the protruded portion 13b has been deprived of the ink repellent film, and has become the non-ink repellent region 26. For this reason, the protective member 15 can be joined therewith by an adhesive 35. After the joining step of the protective member 15, the process goes through a cutting step by a dicing device, resulting in the completion of the element substrate.

When the nozzle substrate 13 is thin (e.g., about 1 μm to 50 μm), the nozzle plate is broken due to the excessive contact with the nozzle at the time of wiping of the recovery operation of ejection. For this reason, the protective member 15 is provided so as to minimize the contact between the cleaning member and the nozzle substrate 13. As the protective member 15, in consideration of the mechanical strength, a metal is desirable, and a SUS, an aluminum alloy, a nickel alloy, or the like is preferable, and other than these, silicon is also desirable. Incidentally, provision of a protruded portion such as the protruded portion 13b or the protective member 15 in the vicinity of the nozzle 45 may adversely affect the ejection performance. For this reason, the protective member 15 is desirably provided at a position appropriately separated from the nozzle 45. Specifically, the protruded portion 13b or the protective member 15 is desirably provided away from the nozzle 45 enough not to overlap the foaming chamber 44 as seen from the direction perpendicular to the ejection port surface 13a.

From the description up to this point, in accordance with the present embodiment, the ink repellent film in the ink repellent region in the vicinity of the nozzle is formed with the vacuum evaporation method. For this reason, a stable liquid repellency performance can be obtained, which can prevent the reduction of the ejection performance. Further, with the position separated from the nozzle set as the non-ink repellent region, a protective member for protecting the nozzle plate can be provided. For this reason, the strength with respect to the nozzle recovery operation, or the like is improved, which can prevent the breakage of the nozzle. Therefore, it is possible to manufacture an element substrate having a stable ejection performance.

Figure 3A:
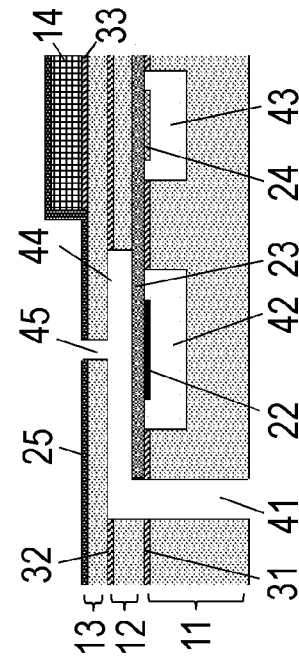
FIGS. 3A to 3F are each a view illustrating a method for manufacturing an element substrate in accordance with a second embodiment.
Figure 3B:
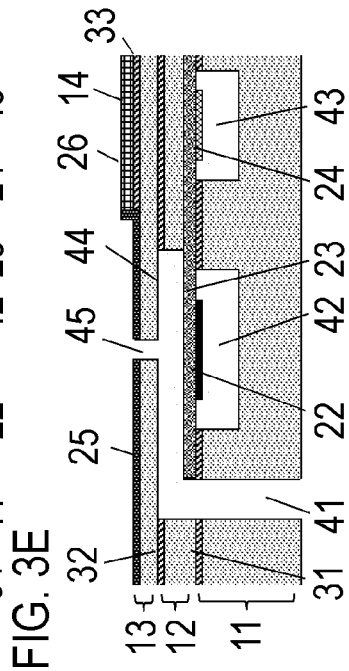
Figure 3C:
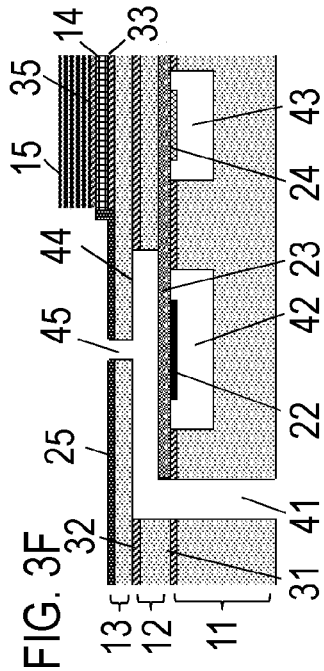

Further, in accordance with the present embodiment, as shown in FIG. 3C, the ink repellent region 25 is also formed on the vertical wall on the ejection port surface 13a side of the protruded portion 13b. Therefore, it becomes possible to reduce the surface energy of not only the nozzle surface but also the vertical wall portion. Accordingly, it is possible to discharge an ink favorably without allowing droplets, or the like to stay at the corner portions of the boundary between the nozzle surface and the vertical wall portion.

Second Embodiment

Then, a description will be given to a configuration in which a hard mask substrate previously processed into a prescribed shape is newly provided with respect to the first embodiment as a second embodiment. Below, the characteristic parts of the second embodiment will be mainly described, and the same configuration as that of the first embodiment is given the same reference numeral and sign, and will not be described.

The schematic configuration of the element substrate in accordance with a second embodiment is the same as that of the first embodiment shown in FIG. 1. Namely, the upper surface of the substrate 1 is formed in a step shape, and the substrate 1 has an ejection port surface 1a of the ink repellent region 5, and a protruding surface 1b of the non-ink repellent region 6 formed higher than the ejection port surface 1a. Further, the substrate 1 of the present embodiment is configured so as to include a hard mask substrate 14 in addition to the passage substrate 11, the actuator substrate 12, and the nozzle substrate 13.

FIGS. 3A to 3F are each a cross sectional schematic view showing a method for manufacturing an element substrate in accordance with the second embodiment. In the present embodiment, as shown in FIG. 3A, the passage substrate 11, the actuator substrate 12, and the nozzle substrate 13 are processed into their respective prescribed shapes by photolithography before joining of the hard mask substrate 14.

The hard mask substrate 14 has been previously processed before joining, and a first processed portion 46 is formed on the lower surface side. The first processed portion 46 allows the lower surface of the hard mask substrate 14 to be formed in a step shape. The hard mask substrate 14 has an opposed portion 14a opposed to the nozzle 45, and a joint portion 14b protruding toward the substrate side, and to be joined with the nozzle substrate 13. The first processed portion 46 becomes an opposed space between the ejection port surface 13a of the nozzle substrate 13 and the opposed portion 14a when the hard mask substrate 14 is joined with the nozzle substrate 13, and contributes to shortening of the grinding step. The hard mask substrate 14 preferably has, for example, a total thickness of substrates of 400 μm to 725 μm, and the first processed portion 46 with a height of 100 μm to 200 μm is formed on the lower surface side.

After processing into a prescribed shape, as shown in FIG. 3B, a mask joining step in which the hard mask substrate 14 is joined onto the nozzle substrate 13 by an adhesive 33 is performed. When the joint portion 14b of the hard mask substrate 14 is joined onto the nozzle substrate 13, the first processed portion 46 is situated at the position corresponding to right above the foaming chamber 44 between the nozzle substrate 13 and the hard mask substrate 14. Namely, after the joining step of the hard mask substrate 14, a space is formed in the vicinity above the nozzle 45. Further, the joint portion 14b is provided at the position not overlapping the foaming chamber 44 as seen from the direction perpendicular to the ejection port surface 13a. With such an arrangement configuration, the boundary between the ink repellent region and the non-ink repellent region formed in a later step is formed at the position separated from the nozzle 45.

Then, as shown in FIG. 3C, a grinding step is performed as the mask portion removing step in which the top of the hard mask substrate 14 is removed together with the ink repellent region 25 by grinding or the like. As a result, the top of the nozzle 45 on the nozzle substrate 13 is opened. At this step, the first processed portion 46 of the hard mask substrate 14 has been previously processed, which can shorten the time-consuming grinding step.

Figure 3D:
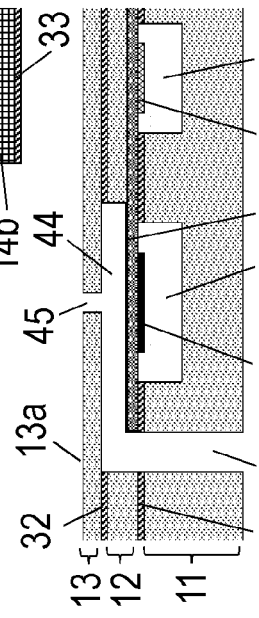
Figure 3E:
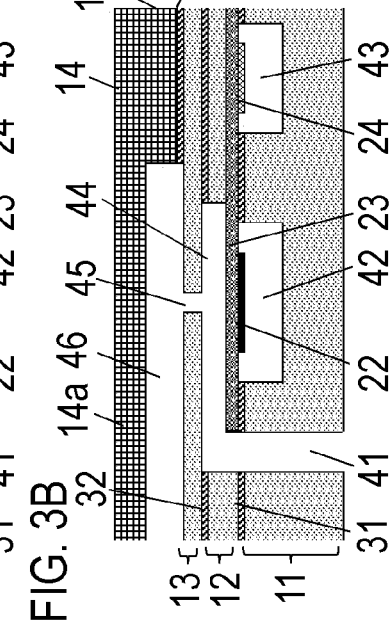
Figure 3F:
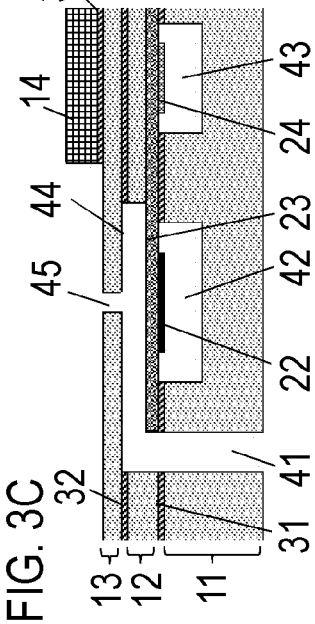

Then, as shown in FIG. 3D, a liquid repellent treatment step in which an ink repellent film is formed on the upper surface of the nozzle substrate 13 and the hard mask substrate 14 with the vacuum evaporation method is performed, thereby forming the ink repellent region 25. Then, as shown in FIG. 3E, a grinding step is performed again as a liquid repellent region removing step in which the top of the hard mask substrate 14 is ground together with the ink repellent region 25. As a result, the non-ink repellent region 26 is exposed on the hard mask substrate 14 (on the hard mask). At this step, the opposed portion 14a is fully removed, and only a part of the joint portion 14b remains on the nozzle substrate 13. In the present embodiment, the height of the hard mask substrate 14 after grinding relative to the ejection port surface 13a is preferably about 5 μm to 50 μm. Then, as shown in FIG. 3F, a joining step in which the protective member 15 is joined onto the non-ink repellent region 26 of the hard mask substrate 14 is performed.

In accordance with the present embodiment, when a nozzle or the like is formed in the substrate by photolithography, a protruded portion is not provided on the surface of the substrate. For this reason, stable formation is possible, and the dimensional precision of the nozzle or the like is improved. Further, the positional precision of the boundary between the ink repellent region and the non-ink repellent region depends upon the arrangement precision of the hard mask substrate upon joining the hard mask substrate. For this reason, the deviation amount from the design value can be suppressed to about 10 µm or less.

From the description up to this point, in accordance with the present embodiment, by the vacuum evaporation method, with the nozzle vicinity set as the ink repellent region, and with position separated from the nozzle set as the non-ink repellent region, a protective member for protecting the nozzle plate can be provided. Therefore, the liquid repellent treatment property can be stabilized, and breakage of the nozzle can be prevented, which can manufacture an element substrate having a stable ejection performance.

Third Embodiment

Then, as a third embodiment, a description will be given to a configuration in which the ejection port surface for forming an ejection port therein and the bonding surface for bonding a protective member thereon are the same surface. Below, the characteristic part of the third embodiment will be mainly described, and the same configuration as that of the first embodiment is given the same reference numeral and sign, and will not be described.

FIG. 4 is a schematic view of an element substrate 300 in accordance with a third embodiment. The element substrate 300 is formed such that on a substrate 10, a piezoelectric element 2 and a diaphragm 3 are arranged, and a passage 7, a foaming chamber 8, and a nozzle 4 are formed in communication with one another. In an ejection port surface 10a of the substrate 10, a plurality of ejection ports 4a of the nozzle 4 are formed, and a protective member 9 protruding with respect to the ejection port surface 10a is provided on the ejection port surface 10a. Namely, the third embodiment is different from the first embodiment in that the surface of the substrate 10 in which the ejection ports 4a are formed and the surface on which the protective member 9 is provided are the same surface.

Also in the present embodiment, the protective member 9 is provided at a position not overlapping the foaming chamber 8 as seen from the direction of protrusion of the protective member 9 (the stacking direction of the substrate 10). Namely, it is configured such that the protective member 9 can suppress the reduction of the ejection performance.

Of the ejection port surface 10a, the vicinity of the ejection port 4a is an ink repellent region 5 subjected to a liquid repellent treatment, and the region in which the protective member 9 is provided is a non-ink repellent region 6. The ink repellent region 5 is formed to the end on the ejection port 4a side of the protective member 9, and the boundary between the ink repellent region 5 and the non-ink repellent region 6 overlaps the end of the protective member 9.

Figure 5A:
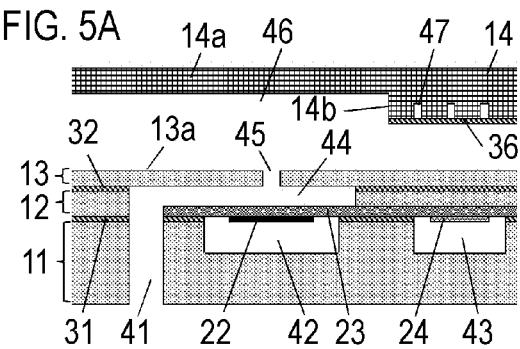
FIGS. 5A to 5G are each a view illustrating a method for manufacturing the element substrate in accordance with the third embodiment.

Then, regarding a method for manufacturing the element substrate 300, a method for forming an ink repellent region characteristic of the present invention will be mainly described. FIGS. 5A to 5G are each a cross sectional schematic view showing a method for manufacturing the element substrate 300 in accordance with the third embodiment. In the present embodiment, as shown in FIG. 5A, before joining of a hard mask substrate 14, a passage substrate 11, an actuator substrate 12, and a nozzle substrate 13 are processed into their respective prescribed shapes with photolithography.

The hard mask substrate 14 of the present embodiment has been previously processed before joining. On the lower surface side, a first processed portion 46 and a second processed portion 47 are formed. The first processed portion 46 allows the lower surface of the hard mask substrate 14 to be formed in a step shape. The hard mask substrate 14 has an opposed portion 14a opposed to the nozzle 45, and a joint portion 14b to be joined with the nozzle substrate 13. The hard mask substrate 14 preferably has, for example, a total thickness of substrates of 400 µm to 725 µm, and the depth of the first processed portion 46 is preferably 100 µm to 200 µm. The first processed portion 46 is a portion processed for forming an opposed space between the opposed portion 14a of the hard mask substrate 14 and the ejection port surface 13a of the nozzle substrate 13 after joining between the mask substrate 14 and the nozzle substrate 13 in order to shorten the grinding step as with the second embodiment.

The second processed portion 47 is formed in a groove shape in the joint portion 14b of the hard mask substrate 14, and is previously processed for performing the subsequent hard mask substrate removing step with ease. The second processed portion 47 is the portion into which a stripping liquid is poured at the hard mask substrate removing step. In order to open the upper surface of the second processed portion 47 after a grinding step, the depth is preferably 50 µm to 100 µm. A plurality of the second processed portions 47 are formed in the lower surface of the hard mask substrate 14, and increases the contact area between the stripping liquid and the hard mask substrate 14 upon pouring of the stripping liquid. Namely, the hard mask substrate 14 in the present embodiment is exposed to a chemical substance and is removed in the process of manufacturing the element substrate 300. A joint material 36 for joining the hard mask substrate 14 to the nozzle substrate 13 is removed simultaneously with the hard mask substrate 14. Therefore, for the joint material 36, not an adhesive but a material which is a chemical substance such as a resist, and is easy to dissolve is preferably used.

Figure 5B:
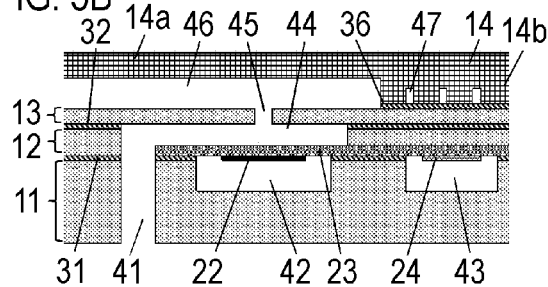

After processing into a prescribed shape, as shown in FIG. 5B, a mask joining step in which the hard mask substrate 14 is joined onto the nozzle substrate 13 by the joint material 36 is performed. When the hard mask substrate 14 is joined onto the nozzle substrate 13, the first processed portion 46 is situated at the position corresponding to right above the foaming chamber 44 between the nozzle substrate 13 and the hard mask substrate 14. Namely, after the joining step of the hard mask substrate 14, a space is formed in the vicinity above the nozzle 45.

Figure 5C:
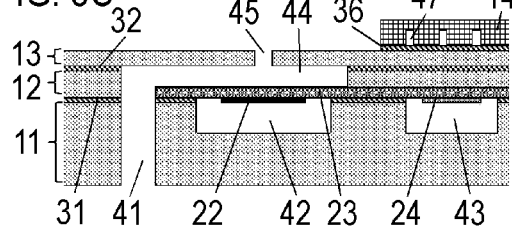

Then, as shown in FIG. 5C, a grinding step is performed as the mask portion removing step in which the top of the hard mask substrate 14 is removed together with the ink repellent region 25 by grinding or the like is performed. As a result, the top of the nozzle 45 on the nozzle substrate 13 is opened. At this step, the first processed portion 46 of the hard mask substrate 14 has been previously processed, and hence the time-consuming grinding step can be shortened.

Figure 5D:
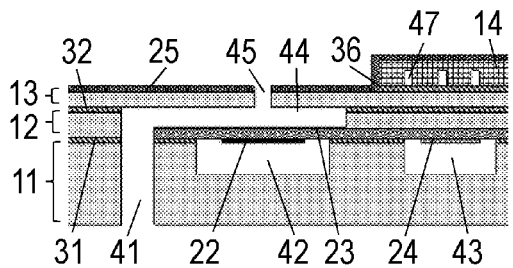
Figure 5E:
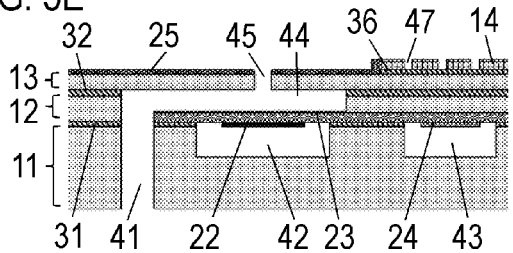

Then, as shown in FIG. 5D, a liquid repellent treatment step in which with the vacuum evaporation method, an ink repellent film is formed on the upper surfaces of the nozzle substrate 13 and hard mask substrate 14 is performed. As a result, an ink repellent region 25 is formed. Then, as shown in FIG. 5E, as the liquid repellent region removing step, the top of the hard mask substrate 14 is ground together with the ink repellent region 25, so that the second processed portion 47 is opened in the upper surface of the hard mask substrate 14. In the present embodiment, the height of the hard mask substrate 14 after grinding with respect to the ejection port surface 13a is preferably about 5 µm to 50 µm.

FIG. 6A is a top view of FIG. 5E, and shows the shape of the second processed portion 47. The second processed portions 47 are formed by processing a plurality of grooves each in a square shape in a cross sectional shape in order to increase the contact area with a stripping liquid in a dissolving step described later. Further, FIG. 6B shows a modified example of the second processed portion 47, and shows the case where the cross sectional shape of the groove is a rectangle. The second processed portion 47 is not limited to the foregoing configuration, and the cross sectional shape or the depth thereof can be freely selected so long as it can facilitate removal of the hard mask substrate.

Figure 5F:
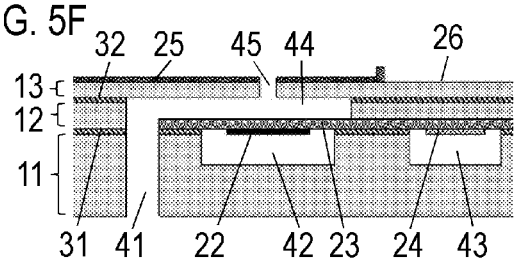
Figure 5G:
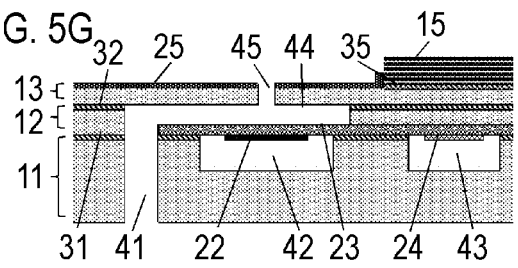

After the grinding step, a mask removing step in which a stripping liquid is poured into the opening of the second processed portion 47, and is dissolved, thereby removing the hard mask substrate 14 is performed. As a result, on the nozzle substrate 13, a non-ink repellent region 26 is formed. FIG. 5F shows the state in which the hard mask substrate 14 has been removed from the top of the nozzle substrate 13, and the portion originally including the hard mask substrate 14 provided therein is exposed as the non-ink repellent region 6. As the stripping liquid, a resist stripping liquid soluble in a resist, or the like can be used. Subsequently, as shown in FIG. 5G, a joining step in which a protective member 15 is joined onto the non-ink repellent region 26 of the nozzle substrate 13 is performed.

From the description up to this point, in accordance with the present embodiment, with the vicinity of the nozzle set as an ink repellent region, and with the position separated from the nozzle set as a non-ink repellent region by the vacuum evaporation method, a protective member for protecting the nozzle plate can be provided. Therefore, the liquid repellent treatment property is stabilized, and the breakage of the nozzle is prevented. Accordingly, it is possible to manufacture an element substrate having a stable ejection performance. Further, as with the second embodiment, the nozzle or the like can be formed without unevenness on the surface of the substrate by photolithography. For this reason, the dimensional precision of the nozzle or the like is improved as compared with the first embodiment.

Further, in accordance with the present embodiment, the protruded portion is not provided. For this reason, it is also easy to decrease the distance between the recording medium and the nozzle 45. Whether the configuration in which the protruded portion is provided at the substrate as with the first embodiment, or the like is adopted, or the substrate is formed in a flat shape as with the present embodiment can be appropriately selected in consideration of the desirable ejection performance, the difficulty in manufacturing, and the like.

Fourth Embodiment

Then, as a fourth embodiment, a configuration in which the shape of the processed portion of the hard mask substrate has been changed relative to the third embodiment will be described. Below, the part characteristic of the fourth embodiment will be mainly described, and the same configuration as that of the third embodiment is given the same reference numeral and sign, and will not be described.

A schematic configuration of an element substrate in accordance with the fourth embodiment is the same as that of the third embodiment shown in FIG. 4. Namely, the surface in which the ejection port 4a of the substrate 10 is formed and the surface on which the protective member 9 is provided are the same surface. On the ejection port surface 10a, the ink repellent region 5 and the non-ink repellent region 6 are formed.

In the third embodiment, as shown in FIG. 5G, the end on the protective member 9 side of the ink repellent region 25 is formed rising higher than other portions. While the ink repellent film formed in a fence shape in this manner can prevent the droplets from staying at the corner portions as described in the first embodiment, the portion which has risen may be unnecessary, and may become waste according to the configuration of the element substrate. Under such circumstances, in the fourth embodiment, the manufacturing method was changed so as to prevent the ink repellent film from remaining on the portion.

Figure 7A:
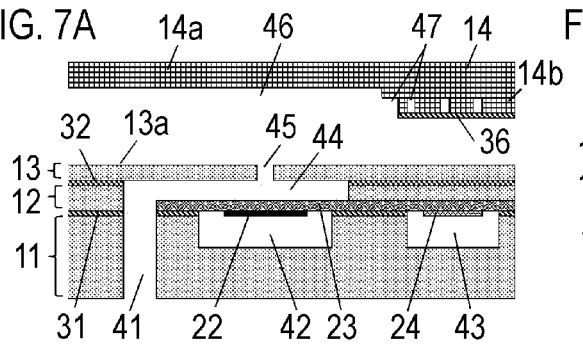
FIGS. 7A to 7G are each a view illustrating a method for manufacturing an element substrate in accordance with a fourth embodiment.

FIGS. 7A to 7G are each a cross sectional schematic view showing a method for manufacturing the element substrate in accordance with the fourth embodiment. In the present embodiment, as shown in FIG. 7A, the hard mask substrate 14 is joined onto the passage substrate 11, the actuator substrate 12, and the nozzle substrate 13 processed in respective prescribed shapes by photolithography.

The hard mask substrate 14 of the present embodiment has been previously processed before joining, and the first processed portion 46 and the second processed portion 47 are formed on the lower surface side. By the first processed portion 46, the lower surface of the hard mask substrate 14 is formed in a step shape, and the hard mask substrate 14 has an opposed portion 14a opposed to the nozzle 45, and a joint portion 14b to be joined with the nozzle substrate 13. The hard mask substrate 14 preferably has a total thickness of substrates of, for example, 400 μm to 725 μm. The first processed portion 46 is provided for shortening the grinding step, and the depth of the first processed portion 46 is preferably 100 μm to 200 μm. The second processed portion 47 is formed at the joint portion 14b for removing the hard mask substrate 14, and the depth of the second processed portion 47 is preferably 50 μm to 100 μm.

The second processed portion 47 of the present embodiment is different from that of the third embodiment in that the edge on the first processed portion 46 side (the opposed portion side) of the joint portion 14b is also processed. The edge portion adjacent to the first processed portion 46 on the lower surface side of the hard mask substrate 14 is also previously processed. This can prevent the ink repellent film from remaining in a fence shape.

Figure 7B:
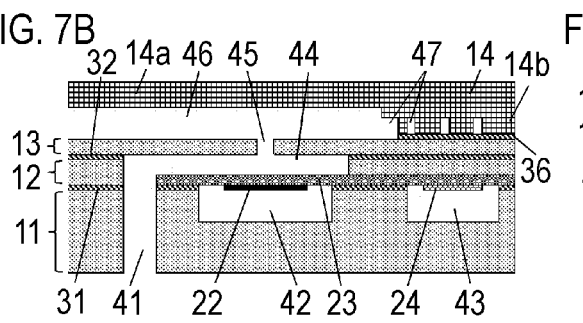
Figure 7C:
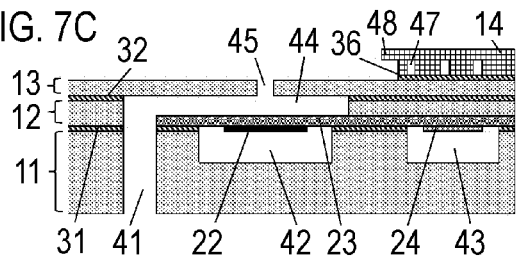

The joining step of the hard mask substrate 14 shown in FIG. 7B in the present embodiment, and the grinding step of the top of the hard mask substrate 14 shown in FIG. 7C are the same as those of the third embodiment. After the grinding step, the second processed portion 47 is configured as described above. As a result, at the end on the nozzle 45 side of the hard mask substrate 14, an eaves portion 48 protruding from the top of the hard mask substrate 14 after grinding toward the nozzle 45 side remains.

Figure 7D:
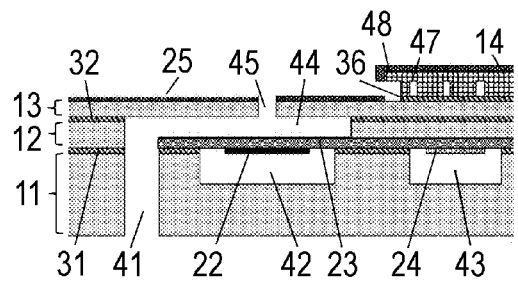

Subsequently, as shown in FIG. 7D, a liquid repellent treatment step in which an ink repellent film is formed on the nozzle substrate 13 and the hard mask substrate 14 with the vacuum evaporation method is performed. In the present embodiment, by the eaves portion 48, the ink repellent region 25 is formed in a different form from that of the third embodiment. Of the portion of the ejection port surface 13a of the nozzle substrate 13 covered with the eaves portion 48, at the end on the nozzle 45 side, an ink repellent film goes around, thereby forming the ink repellent region 25. On the other hand, at the vicinity of the boundary between the nozzle substrate 13 and the hard mask substrate 14, the ink repellent film does not go around, and hence the ink repellent region 25 is not formed. Therefore, in the present embodiment, the ink repellent region 25 is divided by the boundary between the nozzle substrate 13 and the hard mask substrate 14. By adopting such a manufacturing method, the ink repellent film is not formed along the vertical wall portion of the hard mask substrate 14. For this reason, it is possible to prevent the ink repellent film from being formed in a fence, and remaining.

In order to prevent the ink repellent film from going around to the boundary between the nozzle substrate 13 and the hard mask substrate 14, the eaves length (the length of protrusion from the end) of the eaves portion 48 is preferably 50 μm or more. Further, the deeper the depth of the second processed portion 47 is, the shorter the grinding step of removing the hard mask substrate 14 can become. Whereas, the ink repellent film becomes more likely to go around under the eaves portion 48. Therefore, the depth of the second processed portion 47 and the eaves length of the eaves portion 48 may be determined in consideration of the efficiency of the grinding step, the wraparound property of the ink repellent film, and the like.

Figure 7E:
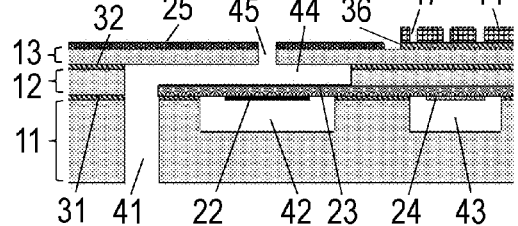
Figure 7F:
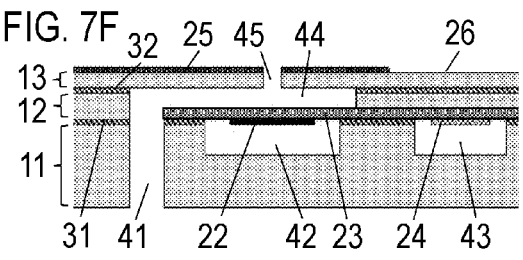
Figure 7G:
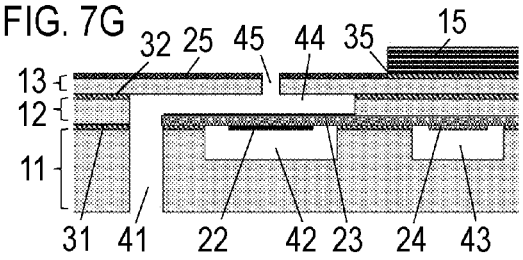

After the ink repellent film forming step, as shown in FIG. 7E, a grinding step is performed as the mask portion removing step in which the top of the hard mask substrate 14 is ground together with the ink repellent region 25. As a result, at the upper surface of the hard mask substrate 14, the second processed portion 47 is opened. Subsequently, a stripping liquid is poured into the opening of the second processed portion 47, and is dissolved. Accordingly, the hard mask substrate 14 is removed, so that the non-ink repellent region 26 is exposed on the nozzle substrate 13. FIG. 7F shows the following state: the mask removing step is performed, and the hard mask substrate 14 is removed from the top of the nozzle substrate 13, so that the portion originally provided with the hard mask substrate 14 is exposed as the non-ink repellent region 26. At this step, in the entire region of the ink repellent region 25, the ink repellent film is formed with a substantially constant thickness. Subsequently, as shown in FIG. 7G, a joining step in which the protective member 15 is joined with the top of the non-ink repellent region 26 of the nozzle substrate 13 is performed.

From the description up to this point, in accordance with the present embodiment, by the vacuum evaporation method, with the vicinity of the nozzle set as an ink repellent region, and with the position separated from the nozzle set as a non-ink repellent region, a protective member for protecting the nozzle plate can be provided. Therefore, the liquid repellent treatment property can be stabilized, and the breakage of the nozzle can be prevented. Thus, it is possible to manufacture an element substrate having a stable ejection performance. Further, as with the third embodiment, the ink repellent film can be prevented from remaining in a fence shape.

Fifth Embodiment

Then, a description will be given to a configuration in which the shape of the processed part of the hard mask substrate is changed relative to the third embodiment and the fourth embodiment as a fifth embodiment. Below, the characteristic parts of the fifth embodiment will be mainly described, and the same configuration as that of the third embodiment is given the same reference numeral and signs, and will not be described.

The schematic configuration of the element substrate in accordance with the fifth embodiment is the same as that of the third embodiment shown in FIG. 4. Namely, the surface in which the ejection port 4a of the substrate 10 is formed, and the surface to be provided with the protective member 9 are the same surface. On the ejection port surface 10a, the ink repellent region 25 and the non-ink repellent region 26 are formed.

In the third embodiment, the method for manufacturing an element substrate included the step of pouring a stripping liquid as the removing step of the hard mask substrate 14. On the other hand, in the present embodiment, the manufacturing method was changed so that the removing step of the hard mask substrate can also serve as the cutting step of cutting a silicon wafer by a dicing device, or the like, and obtaining individual element substrates.

Figure 8A:
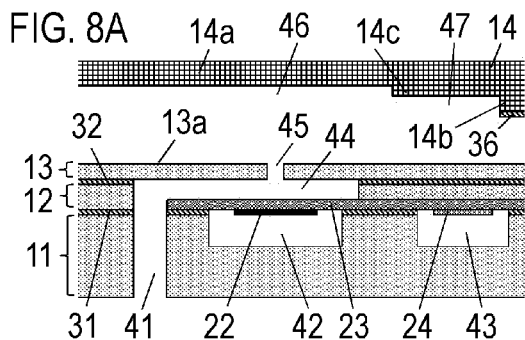
FIGS. 8A to 8G are each a view illustrating a method for manufacturing an element substrate in accordance with a fifth embodiment.

FIGS. 8A to 8G are each a cross sectional schematic view showing a method for manufacturing an element substrate in accordance with the fifth embodiment. In the present embodiment, as shown in FIG. 8A, the hard mask substrate 14 is joined onto the passage substrate 11, the actuator substrate 12, and the nozzle substrate 13 processed into their respective prescribed shapes by photolithography.

The hard mask substrate 14 of the present embodiment has been previously processed before joining, and the first processed portion 46 and the second processed portion 47 are formed on the lower surface side. By the first processed portion 46 and the second processed portion 47, the lower surface of the hard mask substrate 14 is formed in a step shape. The hard mask substrate 14 has an opposed portion 14a opposed to the nozzle 45, a joint portion 14b to be joined with the nozzle substrate 13, and an intermediate portion 14c situated between the opposed portion 14a and the joint portion 14b. The hard mask substrate 14 preferably has a total thickness of substrates of, for example, 400 μm to 725 μm. The first processed portion 46 is provided for shortening the grinding step, and the depth of the first processed portion 46 is preferably 100 μm to 200 μm.

As described above, the second processed portion 47 of the present embodiment is processed so that the lower surface of the hard mask substrate 14 is formed in a step shape as with the first processed portion 46. The depth of the second processed portion 47 is preferably 50 μm to 100 μm, and is formed shallower than the first processed portion 46. Namely, the intermediate portion 14c is closer to the ejection port surface 13a than the opposed portion 14a, and is at a position more distant from the ejection port surface 13a than the joint portion 14b in the direction perpendicular to the ejection port surface 13a.

Figure 8B:
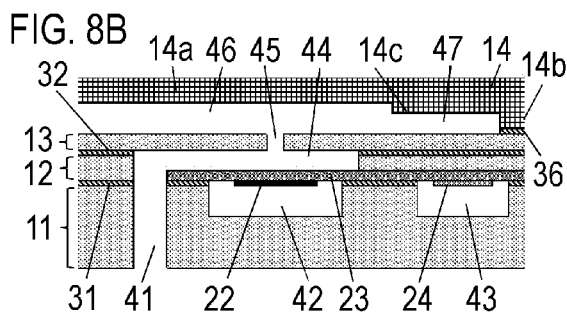
Figure 8C:
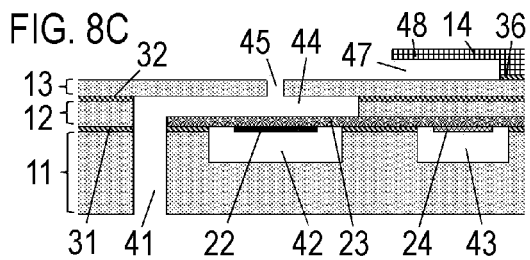

The joining step of the hard mask substrate 14 shown in FIG. 8B, and the grinding step of the top of the hard mask substrate 14 shown in FIG. 8C in the present embodiment are the same as those in the third embodiment. After the grinding step, the second processed portion 47 has the foregoing configuration, resulting in the formation of the eaves portion 48 protruding from the top of the hard mask substrate 14 after grinding toward the nozzle 45 side at the end on the nozzle 45 side of the hard mask substrate 14. Further, the eaves length of the eaves portion 48 of the present embodiment is formed longer than that of the fourth embodiment.

Figure 8D:
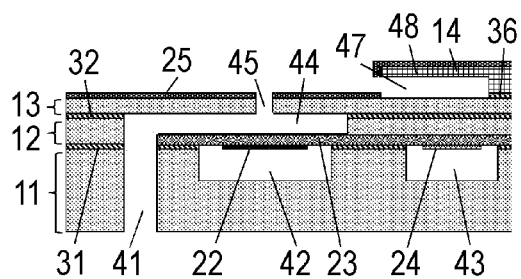

Subsequently, as shown in FIG. 8D, by the vacuum evaporation method, an ink repellent film is formed on the nozzle substrate 13 and the hard mask substrate 14. Also in the present embodiment, the ink repellent region 25 is not formed in the vicinity of the boundary between the nozzle substrate 13 and the hard mask substrate 14, and the ink repellent region 25 is divided at the boundary between the nozzle substrate 13 and the hard mask substrate 14. In the present embodiment, as compared with the fourth embodiment, the eaves length of the eaves portion 48 is larger. For this reason, the region in which the ink repellent region 25 is not formed becomes larger. With such a manufacturing method, the ink repellent film is not formed along the vertical wall portion of the hard mask substrate 14. This can prevent the ink repellent film from being formed in a fence shape, and remaining. The depth of the second processed portion 47 and the eaves length of the eaves portion 48 may be determined in consideration of the efficiency of the grinding step, the wraparound property of the ink repellent film, and the like.

Figure 8E:
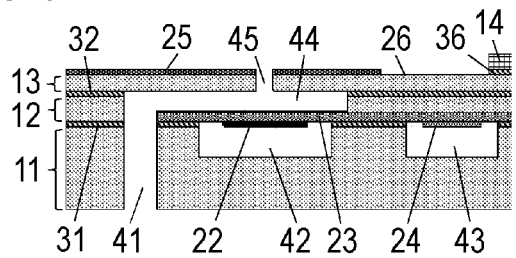
Figure 8F:
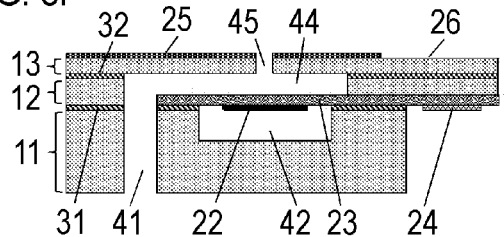
Figure 8G:
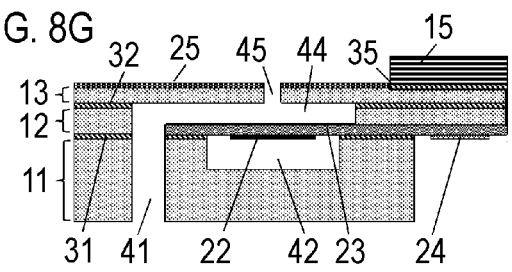

After the ink repellent film forming step, as shown in FIG. 8E, a grinding step is performed as the mask portion removing step in which the top of the hard mask substrate 14 is ground together with the ink repellent region 25. As a result, the non-ink repellent region 26 is formed at the upper surface of the hard mask substrate 14. After the grinding step, the residual portion of the base portion of the eaves portion 48 of the hard mask substrate 14 is situated only at the portion to be cut by a dicing device in a later cutting step. Therefore, as shown in FIG. 8F, the cutting step is performed. As a result, the plurality of element substrates formed on the silicon wafer are individually separated, and the hard mask substrate 14 is removed from the top of the element substrate. Then, as shown in FIG. 8G, a joining step in which the protective member 15 is joined with the top of the nozzle substrate 13 from which the hard mask substrate 14 has been removed is performed.

From the description up to this point, in accordance with the present embodiment, by the vacuum evaporation method, with the vicinity of the nozzle set as an ink repellent region, and with the position separated from the nozzle set as a non-ink repellent region, a protective member for protecting the nozzle plate can be provided. Therefore, the liquid repellent treatment property is stabilized, and the breakage of the nozzle is prevented. As a result, it is possible to manufacture an element substrate having a stable ejection performance. Further, it becomes unnecessary to perform a hard mask substrate removing step in which a stripping liquid, or the like is poured for removing the hard mask substrate 14 between the grinding step and the cutting step. This leads to shortening of the step.

Up to this point, the embodiments of the present invention have been described exemplarily. However, the present invention is not limited to the foregoing embodiments. For example, various changes such as manufacturing of an element substrate by joining a hard mask substrate having a first processed portion and a second processed portion onto a substrate having a protruded portion are possible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-055449, filed on Mar. 30, 2022, which is hereby incorporated by reference herein in its entirety.

What is claimed is:

1. A method for manufacturing an element substrate for use in a liquid ejection head for ejecting a liquid to a recording medium, the element substrate comprising:
a substrate having a nozzle including an ejection port opposed to the recording medium, and a pressure generating chamber communicating with the nozzle, and subjected to a liquid repellent treatment on a part of an ejection port surface including the ejection port formed therein; and
a generating element for generating an energy for ejecting the liquid in the pressure generating chamber from the ejection port,
the method comprising:
a liquid repellent treatment step of performing the liquid repellent treatment on the substrate; and
a liquid repellent region removing step of removing a part of a liquid repellent region which is subjected to the liquid repellent treatment such that a non-liquid repellent region which is not subjected to the liquid repellent treatment is exposed at a surface of the substrate opposed to the recording medium,
wherein the substrate has a protruded portion protruding from the ejection port surface toward a recording medium side, and
wherein the liquid repellent region removing step removes a top of the protruded portion subjected to the liquid repellent treatment by grinding.

2. The method according to claim 1, further comprising:
after the liquid repellent region removing step, a joining step of joining a protective member onto the non-liquid repellent region by the liquid repellent region removing step.

3. A method for manufacturing an element substrate for use in a liquid ejection head for ejecting a liquid to a recording medium, the element substrate comprising:
a substrate having a nozzle including an ejection port opposed to the recording medium, and a pressure generating chamber communicating with the nozzle, and subjected to a liquid repellent treatment on a part of an ejection port surface including the ejection port formed therein; and
a generating element for generating an energy for ejecting the liquid in the pressure generating chamber from the ejection port,
the method comprising:
a liquid repellent treatment step of performing the liquid repellent treatment on the substrate;
a liquid repellent region removing step of removing a part of a liquid repellent region which is subjected to the liquid repellent treatment such that a non-liquid repellent region which is not subjected to the liquid repellent treatment is exposed at a surface of the substrate opposed to the recording medium;
before the liquid repellent treatment step, a mask joining step of joining a hard mask to the ejection port surface of the substrate; and
a mask portion removing step of removing a portion of the hard mask opposed to the nozzle,
wherein the hard mask has an opposed portion opposed to the pressure generating chamber, and a joint portion protruding toward a substrate side with respect to the opposed portion, and jointed with the substrate, and
wherein the joint portion is provided at a position not overlapping the pressure generating chamber as seen from a direction perpendicular to the ejection port surface.

4. The method according to claim 3, wherein the liquid repellent region removing step grinds and removes the liquid repellent region and a part of the hard mask.

5. The method according to claim 4, further comprising:
after the liquid repellent region removing step, a joining step of joining a protective member onto a non-liquid repellent region formed on the hard mask by the liquid repellent region removing step.

6. The method according to claim 3, further comprising:
after the liquid repellent region removing step, a mask removing step of dissolving and removing the hard mask.

7. The method according to claim 6, further comprising:
after the mask removing step, a joining step of joining a protective member onto a non-liquid repellent region formed on the substrate by the mask removing step.

8. The method according to claim 6, wherein the hard mask includes a groove extending in the direction perpendicular to the ejection port surface and formed in the joint portion.

9. The method according to claim 8, wherein the groove is formed at an edge on an opposed portion side of the joint portion.

10. The method according to claim 6, wherein the hard mask further has an intermediate portion situated between the opposed portion and the joint portion, and
wherein the intermediate portion is at a position closer to the ejection port surface than the opposed portion, and more distant from the ejection port surface than the joint portion in the direction perpendicular to the ejection port surface.

* * * * *